US008248700B1

(12) United States Patent
Zorabedian

(10) Patent No.: US 8,248,700 B1
(45) Date of Patent: Aug. 21, 2012

(54) SYSTEMS AND METHODS FOR COHERENT BEAM COMBINING OF LASER ARRAYS

(75) Inventor: Paul Zorabedian, Mountain View, CA (US)

(73) Assignee: Lockheed Martin Corporation, Bethesda, MD (US)

( * ) Notice: Subject to any disclaimer, the term of this patent is extended or adjusted under 35 U.S.C. 154(b) by 177 days.

(21) Appl. No.: 12/581,865

(22) Filed: Oct. 19, 2009

Related U.S. Application Data

(60) Provisional application No. 61/106,891, filed on Oct. 20, 2008.

(51) Int. Cl.
*G02B 27/10* (2006.01)
(52) U.S. Cl. ........................................ 359/618
(58) Field of Classification Search .................. 359/618, 359/641
See application file for complete search history.

(56) References Cited

U.S. PATENT DOCUMENTS

| | | | |
|---|---|---|---|
| 6,353,502 B1 * | 3/2002 | Marchant et al. | 359/626 |
| 6,511,186 B1 * | 1/2003 | Burstyn et al. | 353/76 |

OTHER PUBLICATIONS

Corcoran, et al., "Operation of five individual diode lasers as a coherent ensemble by fiber coupling into an external cavity", Appl. Phys. Lett., Aug. 12, 1991, pp. 759-761, vol. 59, No. 7, American Institute of Physics.
Ehbets, et al., "High-efficiency continuous surface-relief gratings for two-dimensional array generation", Optics Letters, Jul. 1, 1992, pp. 908-910, vol. 17, No. 13, Optical Society of America.
Hergenhan, et al., "Coherent coupling of vertical-cavity surface-emitting laser arrays and efficient beam combining by diffractive optical elements: concept and experimental verification", Applied Optics, Mar. 20, 2003, pp. 1667-1680, vol. 42, No. 9, Optical Society of America.
Hergenhan, et al., "Experiments on the Scalability of the Coherent Coupling of VCSEL Arrays", Proceedings of SPIE, 2002, pp. 158-167, vol. 4649.
Leger, et al., "Coherent laser addition using binary phase gratings", Applied Optics, Oct. 15, 1987, pp. 4391-4399, vol. 26, No. 20, Optical Society of America.
Rediker, et al., "Operation of a Coherent Ensemble of Five Diode Lasers in an External Cavity", IEEE Journal of Quantum Electronics, Jun. 1991, pp. 1582-1593, vol. 27, No. 6.
Rediker, et al., "Operation of individual diode lasers as a coherent ensemble controlled by a spatial filter within an external cavity", App. Phys. Lett., Jan. 15, 1995, pp. 133-135, vol. 46, No. 2, American Institute of Physics.
Seurin, et al., "High-power vertical-cavity surface-emitting arrays", Proc. of SPIE, 2008, pp. 68760D-1-68760D-9, vol. 6876. Sidick, et al., "Design and rigorous analysis of high-efficiency array generators", Applied Optics, May 10, 1993, pp. 2599-2605, vol. 32, No. 14, Optical Society of America.

* cited by examiner

*Primary Examiner* — James Jones
(74) *Attorney, Agent, or Firm* — McDermott Will & Emery LLP

(57) ABSTRACT

Systems and methods for coherent beam combining are provided. In some aspects, a system may comprise a first array of laser emitters configured to emit a first array of output beams along a first optical path. The system may also comprise a first array of collimating lenses configured to collimate the first array of output beams. The system may also comprise a first lens configured to focus the first array of output beams at a first focal plane. The system may also comprise a first phase screen configured to combine the first array of output beams at the first focal plane to generate one or more first coherently combined beams. Each of the one or more first coherently combined beams corresponds to a phase combination of the first array of output beams.

21 Claims, 10 Drawing Sheets

SYSTEMS AND METHODS FOR COHERENT BEAM COMBINING OF LASER ARRAYS

CROSS-REFERENCES TO RELATED APPLICATIONS

The present application claims the benefit of U.S. Provisional Patent Application Ser. No. 61/106,891, entitled "EXTERNAL CAVITY BEAM COMBINER FOR VERTICAL-CAVITY SURFACE-EMITTING LASER TWO-DIMENSIONAL ARRAYS," filed on Oct. 20, 2008, which is hereby incorporated by reference in its entirety for all purposes.

STATEMENT AS TO RIGHTS TO INVENTIONS MADE UNDER FEDERALLY SPONSORED RESEARCH OR DEVELOPMENT

Not Applicable.

FIELD

The present invention generally relates to lasers and, in particular, relates to systems and methods for coherent beam combining of laser arrays.

BACKGROUND

Lasers may emit light through a process called stimulated emission. Laser light can be temporally and spatially coherent, where the light can either be emitted in a narrow, low-divergence beam, or can be converted into one with the help of optical components such as lenses. For coherent light, the source of the light may produce light waves that are in step and have the same frequencies and identical phase. Lasers may be employed over a huge range of applications including basic scientific research, test and measurement, industrial processing, microelectronics, biomedicine, environmental science, avionics, entertainment and telecommunications.

SUMMARY

According to various aspects of the subject disclosure, systems and methods are provided for coherent combining of beams of an array of laser emitters, which may allow brightness scaling of single-emitter lasers. Such systems and methods provided may be efficient, highly scalable in terms of array size, and independent of precise per-emitter control. Aspects of the subject disclosure may provide these benefits by combining scalable technologies and exploiting the tendency of a laser to oscillate in its lowest-loss mode to drive the self-organization of mutual coherence and proper phasing among the array elements. The need for precision current/temperature control of each array element can be avoided.

According to various aspects of the subject disclosure, a system for combining beams may be provided. The system may comprise a first array of laser emitters configured to emit a first array of output beams along a first optical path. The system may also comprise a first array of collimating lenses disposed along the first optical path after the first array of laser emitters, configured to collimate the first array of output beams. The system may also comprise a first lens disposed along the first optical path after the first array of collimating lenses, configured to focus the first array of output beams at a first focal plane. The system may also comprise a first phase screen disposed along the first optical path after the first lens, configured to combine the first array of output beams at the first focal plane to generate one or more first coherently combined beams. Each of the one or more first coherently combined beams corresponds to a phase combination of the first array of output beams.

According to various aspects of the subject disclosure, a method for combining beams is provided. The method may comprise emitting a first array of output beams along a first optical path and collimating the first array of output beams. The method may also comprise focusing the first array of output beams at a first focal plane. The method may also comprise combining the first array of output beams at the first focal plane to generate one or more first coherently combined beams. Each of the one or more first coherently combined beams corresponds to a phase combination of the first array of output beams.

According to various aspects of the subject disclosure, a system for combining beams is provided. The system may comprise a module for emitting a first array of output beams along a first optical path and a module for collimating the first array of output beams. The module for collimating is disposed along the first optical path after the module for emitting. The system also comprises a module for focusing the first array of output beams at a first focal plane. The module for focusing is disposed along the first optical path after the module for collimating. The system also comprises a module for combining the first array of output beams at the first focal plane to generate one or more first coherently combined beams. Each of the one or more first coherently combined beams corresponds to a phase combination of the first array of output beams. The module for combining is disposed along the first optical path after the module for focusing.

Additional features and advantages of the invention will be set forth in the description below, and in part will be apparent from the description, or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide further understanding of the invention and are incorporated in and constitute a part of this specification, illustrate aspects of the invention and together with the description serve to explain the principles of the invention.

DETAILED DESCRIPTION

Figure 1:
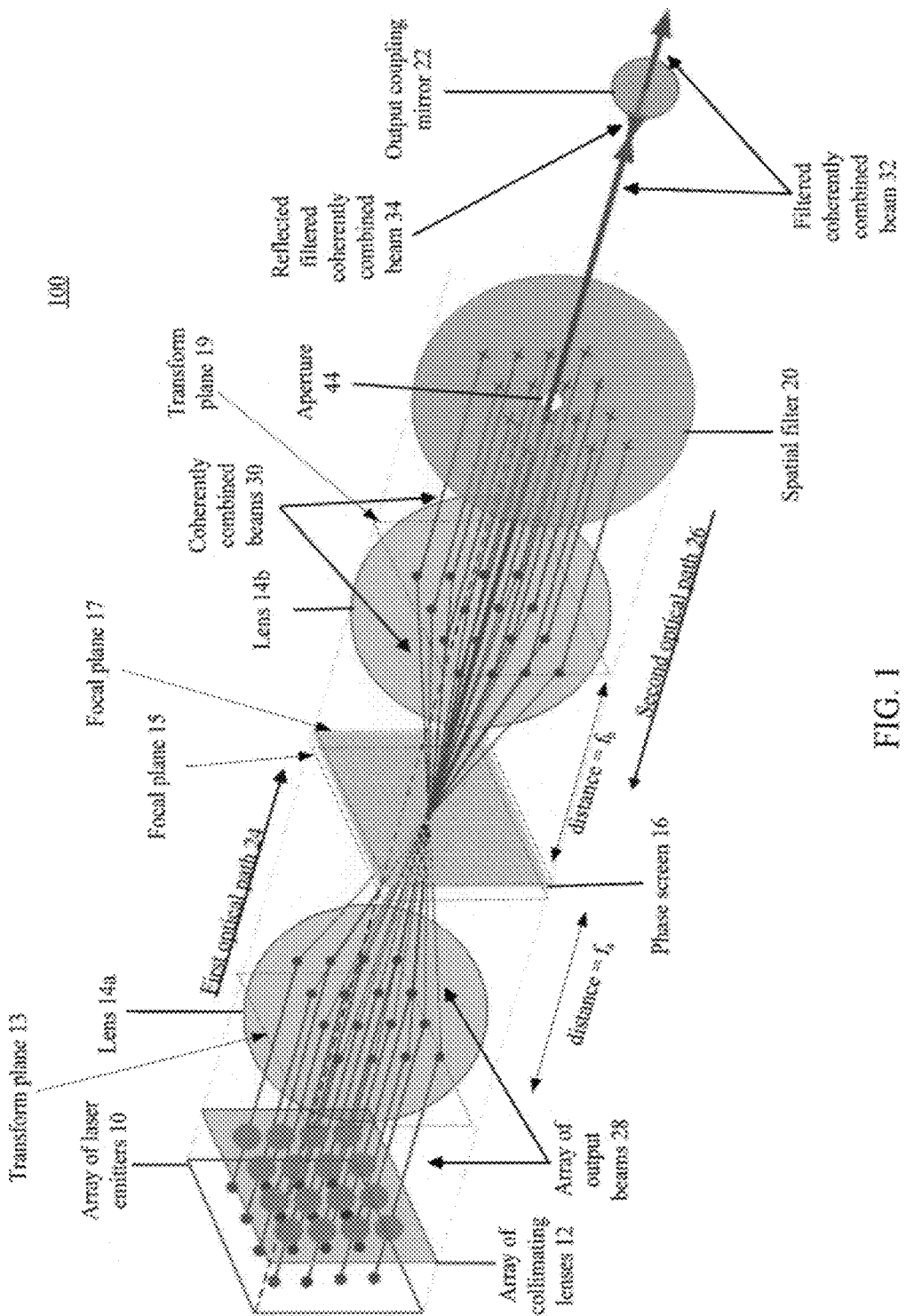
FIG. 1 illustrates an example of an optical system, in accordance with one aspect of the subject disclosure.

In the following detailed description, numerous specific details are set forth to provide a full understanding of the present invention. It will be apparent, however, to one ordinarily skilled in the art that the present invention may be practiced without some of these specific details. In other instances, well-known structures and techniques have not been shown in detail so as not to obscure the present invention.

High-power, high-brightness, high-efficiency laser sources are in demand for a wide and growing variety of military, aero-space, and industrial applications. For example, there is a continuing demand for laser beams with increased brightness for diverse applications, including, but not limited to, directed-energy applications arising in the aerospace and defense industries. The brightness of a laser beam may be defined as the power per unit area per unit solid angle. In some aspects, a beam's brightness characterizes its capability to be tightly focused on a distant target. Owing to a variety of issues related to thermal management and the ability to concentrate pump energy, it may be difficult to increase laser power beyond certain limits in most laser technologies while also maintaining constant beam area and divergence. These technical limitations have led to active research in field of laser beam combining, in which various methods have been tried to combine the output beams of multiple lasers in order to produce a single beam with a brightness greater than can be achieved from a single laser. In some approaches, bundling of several beams by arranging them in parallel and spatially side by side may result in an increase in power but not brightness. According to certain aspects, to increase brightness, the beams may be combined so that they are co-parallel and overlapping in space. Aspects of the subject disclosure relate to coherent beam combining. In some aspects, coherent beam combining may involve taking beams at the same wavelength, making them mutually coherent, and then combining them. The ability to scale the brightness of single-emitter lasers generally faces serious challenges regardless of whether the technology is solid-state, semiconductor, or fiber based.

According to various aspects of the subject disclosure, coherent combining of beams of an array of laser emitters may overcome such challenges and allow brightness and power scaling. For example, coherent beam combining may involve combining output powers of multiple laser emitters to produce a combined beam with increased brightness. One beam-combining approach uses an intensity mask (i.e., an amplitude screen) in a focal plane. This approach can be inherently lossy and has limited scalability. Other beam-combining approaches involve current tuning of each element (e.g., each emitter of an array of laser emitters) or master-slave locking, which involve complex processing techniques. It is thus desirable to provide a beam combining approach that is efficient, highly scalable in terms of array size, and independent of precise per-element active control. Aspects of the subject disclosure provide these benefits by combining scalable technologies and exploiting the tendency of a laser to oscillate in its lowest-loss mode to drive the self-organization of mutual coherence and proper phasing among the array elements. The need for precision current/temperature control of each array element can be avoided.

According to various aspects of the subject disclosure, a single high-power, high-brightness laser beam may be produced through coherent combination of beams of an array of laser emitters. The coherent combination of beams may be scalable to provide combinations of beams from multiple arrays of laser emitters. In some aspects, a design is provided that is amenable to a system engineering approach of specifying properties of constituent components without particularly stressing the technology of any single component. In some aspects, automatic self-organization of mutual-coherence and proper phasing among various laser elements are provided, thereby eliminating the need for precision current and/or temperature control of each individual element.

FIG. 1 illustrates an example of an optical system 100, in accordance with one aspect of the subject disclosure. Optical system 100 may be an external-cavity laser comprising array of laser emitters 10, array of collimating lenses 12, one or more lenses 14 (e.g., lens 14a and lens 14b), phase screen 16, spatial filter 20, and output coupling mirror 22, which are disposed along first optical path 24. In some aspects, optical system 100 may act as an external resonator being added to array of laser emitters 10 to enhance spectral/spatial properties of array of laser emitters 10, such as by phasing the emitters and combining their output beams coherently. For example, array of laser emitters 10 emits an array of output beams 28 along first optical path 24. Array of output beams 28 may travel through one or more optical components of optical system 100 to produce filtered coherently combined beam 32. At least a portion of filtered coherently combined beam 32 may be reflected by output coupling mirror 22 and travel through the one or more optical components of optical system 100 along second optical path 26, which is opposite in direction to first optical path 24. The reflected beam may provide feedback to array of laser emitters 10 such that array of output beams 28 may be produced with phases enhancing the amplitude of filtered coherently combined beam 32.

In some aspects, array of laser emitters 10 may comprise at least one of an array of fiber lasers and an array of vertical-cavity surface-emitting lasers (VCSELs). For example, it may be advantageous to utilize VCSELs because such lasers have excellent beam quality and may be highly-scalable in terms of array size. In some aspects, at least one laser emitter of array of laser emitters 10 may be adjusted such that susceptibility of the at least one laser emitter to receiving an optical beam (e.g., beams traveling along second optical path 26) is increased. For example, a laser emitter of array of laser emitters 10 may comprise a distributed Bragg reflector (DBR). In some aspects, the DBR may be modified or removed entirely to increase susceptibility of the laser emitter to external feedback. In the case of VCSELs, a DBR (e.g., on an emitting side or top-surface) may be removed or may not be present, and the DBR may be replaced with an external cavity. Such a VCSEL may in some aspects be referred to as a vertical external-cavity surface emitting laser (VECSEL).

In the case of an array of fiber lasers, the DBR (e.g., on an emitting side or top-surface) may comprise at least one of a dielectric-stack mirror (e.g., output-facet mirror) or a fiber Bragg grating spliced into the fiber. To increase the susceptibility to external feedback, the fiber Bragg grating may be removed or the dielectric-stack mirror may be eliminated entirely or modified to reduce its reflectivity. In the case where the dielectric-stack mirror is removed entirely, it may be replaced by an anti-reflection dielectric coating comprising a quarter-wave thickness of a low-refractive-index dielectric material such as magnesium fluoride or other suitable materials known to those of skill in the art. In some aspects, array of laser emitters 10 may be a two-dimensional array of lasers. In some aspects, each laser emitter of array of laser emitters 10 may be adjustable such that susceptibility of each laser emitter to receiving an optical beam is increased.

In some aspects, array of collimating lenses 12 is disposed along first optical path 24 after array of laser emitters 10. Array of collimating lenses 12 collimates the array of output beams 28 emitted by array of laser emitters 10 and directs the beams towards lens 14a. In some aspects, array of collimating lenses 12 may comprise a two-dimensional array of micro-lens collimators. Lens 14a is disposed along first optical path 24 after array of collimating lenses 12. Lens 14a focuses array of output beams 28 from array of collimating lenses 12 at focal plane 15. In terms of Fourier optics, lens 14a transforms array of output beams 28 at transform plane 13 into a fan-in (e.g., converging) array of beams that reach a focus at focal plane 15 of lens 14a. The optical field at focal plane 15 comprising the converging array of output beams 28 may be the spatial Fourier transform of the field at transform plane 13. In some aspects, phase screen 16 is disposed so that it lies just behind focal plane 15, which is the back focal plane of lens 14a (as viewed from left to right in FIG. 1). In some aspects, lenses 14 may be referred to as Fourier-transforming lenses.

In some aspects, phase screen 16 is disposed along first optical path 24 after lens 14a and combines the focused array of output beams 28 at focal plane 15 to generate one or more coherently combined beams 30. Each of the coherently combined beams 30 may correspond to a phase combination of array of output beams 28. In some aspects, phase screen 16 may not attenuate amplitudes of array of output beams 28.

Figure 2:
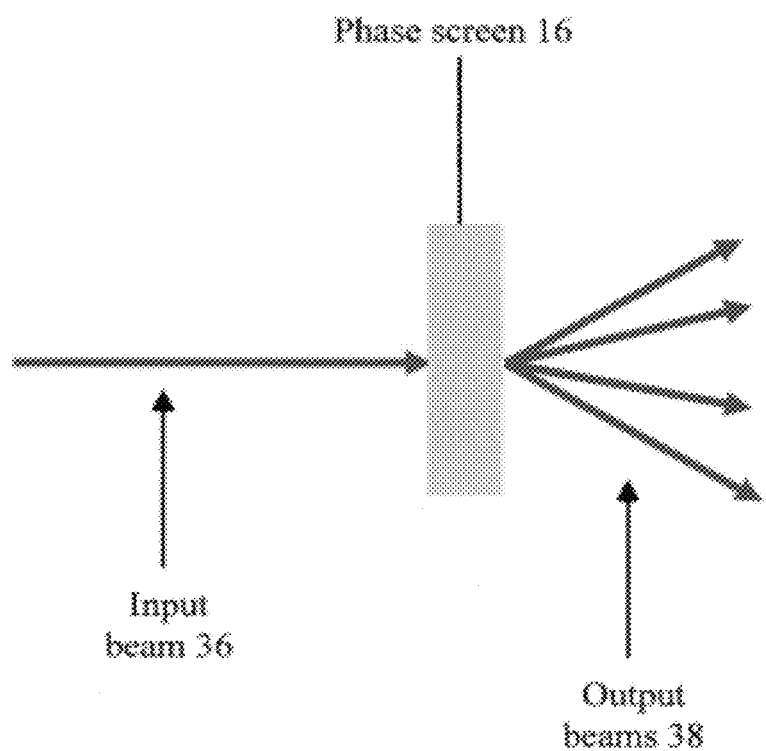
FIG. 2 illustrates an example of a phase screen.

FIG. 2 illustrates an example of a phase screen 16, in accordance with one aspect of the subject disclosure. In some aspects, phase screen 16 may be a phase-only beam combining means (e.g., a two-dimensional phase-only beam combining element) and/or a single diffractive optical element (DOE) (e.g., a DOE spot generator). Phase screen 16 may comprise at least one of glass, fused silica, and quartz. In some aspects, when phase screen 16 receives a single input beam 36, phase screen 16 may generate a 2-dimensional fan-out array of output beams 38 (e.g., divides input beam 36 into output beams 38). In this configuration, output beams 38 have been imparted phases that are distinct from each other. If phase screen 16 receives multiple input beams, each input beam may generate a 2-dimensional fan-out of output beams. Depending on the angles of the multiple input beams, the divided output beams of each input beam may overlap with each other such that they are combined. For example, if four input beams converged at the same angles into phase screen 16 as output beams 38 diverged out from phase screen 16, then phase screen 16 may combine the four input beams into output beams corresponding to the same four output beams 38 shown in FIG. 2. Thus, phase screen 16 may combine multiple input beams to generate one or more combined beams. Each of the combined beams may correspond to a phase combination of the multiple input beams. In some aspects, a phase combination may be referred to as an order.

Figure 3A:
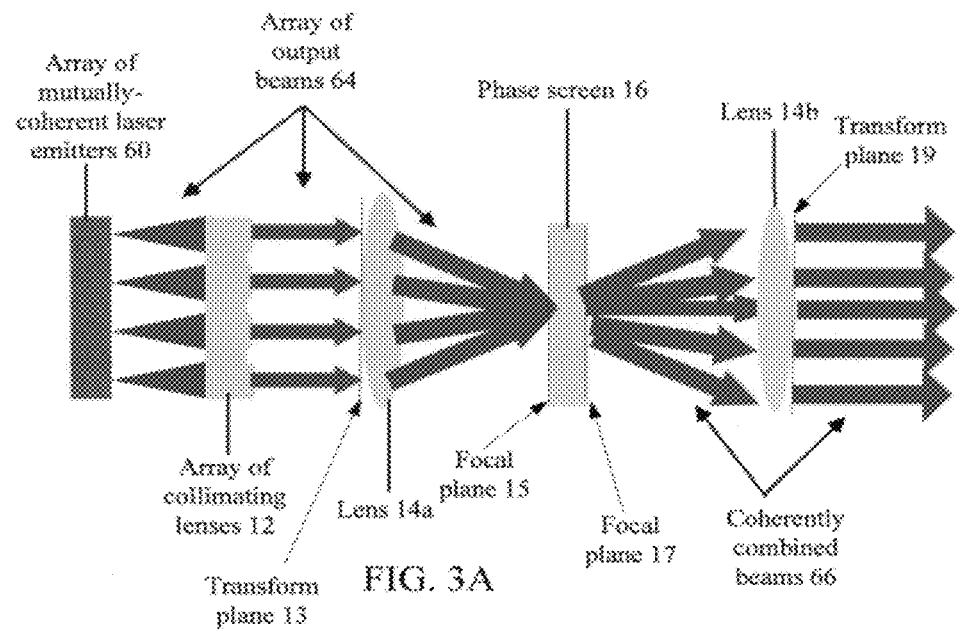
FIG. 3A illustrates an example of a response of a phase screen to inputs from an array of mutually-coherent beams.

FIG. 3A illustrates an example of a response of phase screen 16 to inputs from an array of mutually-coherent beams. Array of mutually-coherent laser emitters 60 emits an array of mutually-coherent output beams 64. Array of collimating lenses 12 collimates array of output beams 64 towards lens 14a. Lens 14a focuses the array of output beams 64 at focal plane 15 towards phase screen 16. Phase screen 16 may combine the array of output beams 64 to generate coherently combined beams 66. Phase screen 16 may impart specific and distinct phases to each of the coherently combined beams 66. In this example, each of coherently combined beams 66 has a comparable intensity to one another. For example, if array of mutually coherent laser emitters 60 comprised N emitters and each emitter puts out one unit power, then the total power coming out of the N emitters is N units of power, which is distributed approximately evenly among the coherently combined beams 66. This may be undesirable because the intensity of array of output beams 64 may be divided among multiple coherently combined beams 66 instead of being concentrated into a single coherently combined beam. Thus, aspects of the subject technology may make laser beams become mutually-coherent and properly phased in order to combine the laser beams (e.g., array of output beams 64) in such a way so as to minimize light on undesired orders and maximize light on a desired order to produce a single coherently combined beam. Thus, using the above example, aspects of the subject technology may produce a coherently combined beam with at least about 0.7N units of power. In some aspects, a coherently combined beam with at least about 0.8N units of power may be produced. In some aspects, a coherently combined beam with at least about 0.9N units of power may be produced.

Figure 3B:
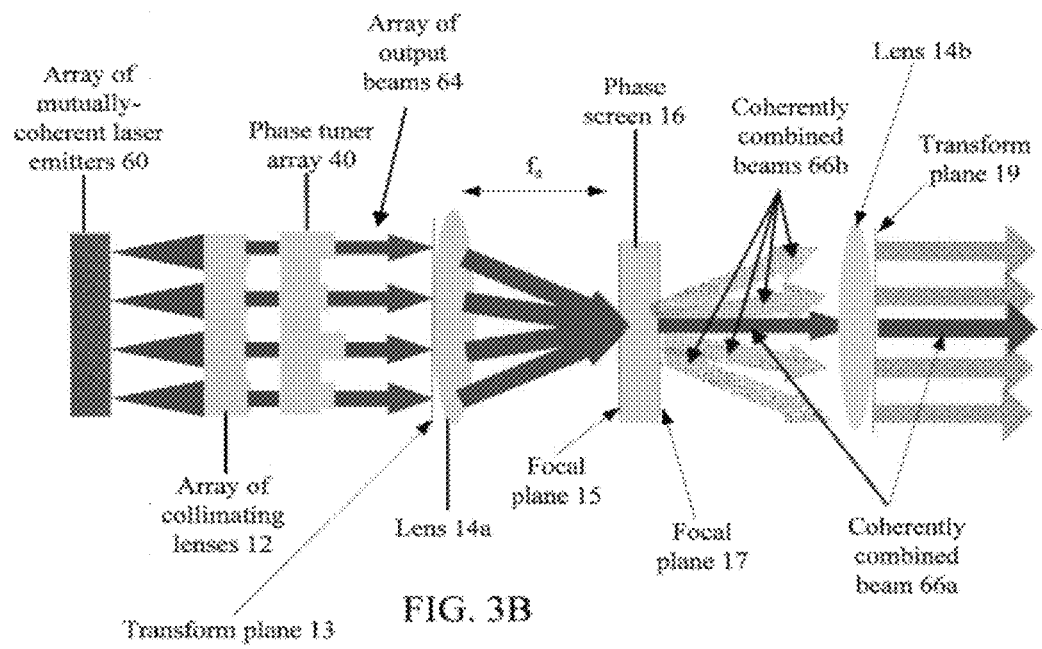
FIG. 3B illustrates an example of a response of a phase screen to inputs from an array of mutually-coherent beams with relative phases between the beams adjusted by a phase tuner array.

FIG. 3B illustrates an example of a response of phase screen 16 to inputs from an array of mutually-coherent beams with relative phases between the beams adjusted by phase tuner array 40. In this example, a phase tuner array 40 is applied to the optical system shown in FIG. 3A to produce a single coherently combined beam. In such a case, phase tuner array 40 may be utilized to select proper delay elements for each emitter of array of mutually-coherent laser emitters 60 such that the net intensity of all orders except for a desired order of phase screen 16 can be adjusted to zero. The selection of such a set of phase delays may be an exercise in linear algebra. Thus, as shown in FIG. 3B, phase screen 16 may combine array of output beams 64 to generate a single coherently combined beam 60a, while the intensities of the other coherently combined beams 60b may be adjusted to substantially zero.

According to various aspects of the subject disclosure, optical system 100 of FIG. 1 may provide dual functions of enforcing mutual coherence and selecting proper relative phasing to produce a single coherently combined beam without having to actively adjust the individual phase of each emitter of an array of laser emitters (e.g., as performed by the optical system of FIG. 3B). Optical system 100 may provide these functions through a feedback system as described in detail below.

Referring back to FIG. 1, the one or more coherently combined beams 30 generated by phase screen 16 propagates to lens 14b. Lens 14b is disposed along first optical path 24 after phase screen 16. Lens 14b is placed so that its front focal plane is coincident with focal plane 17 lying just behind phase screen 16 (as viewed from left to right in FIG. 1). Thus, lens 14b collimates one or more coherently combined beams 30 diverging from phase screen 16. The optical field in transform plane 19, comprising the parallel coherently combined beams 30, may be the spatial Fourier transform of the optical field in focal plane 17. In some aspects, at any instant in time, we may assume that the phases of array of output beams 28 are fixed and that the phase differences between any two beams are fixed. In the absence of phase screen 16, and at a given instant in time, the optical intensity distribution at transform plane 19 may be identical to the optical intensity distribution at transform plane 13 (e.g., the optical field will have been subjected to two spatial Fourier-transform operations by lenses 14). In some aspects, when a spatially non-uniform phase screen 16 is introduced, the optical field distribution at transform plane 19 may no longer be the same as at transform plane 13. Given any definite set of phase relationships between array of output beams 28, it may be possible to design a phase-and-amplitude screen such that the optical field at transform plane 19 comprises substantially a single beam, which may propagate along first optical path 24. In some aspects, given a specific definite set of phase relationships between array of output beams 28, it may be possible to design a phase-only screen such that the optical field at transform plane 19 comprises substantially a single beam, which may propagate along first optical path 24. Use of a phase-only screen (e.g. phase screen 16) is advantageous, since when using a phase-only screen, power loss in the beam-combination process can be minimized compared to use of a phase-and-amplitude screen.

Spatial filter 20 is disposed along first optical path 24 after lens 14b and filters through one of the one or more coherently combined beams 30 corresponding to a desired phase combination of array of output beams 28 (e.g., filtered coherently combined beam 32). Spatial filter 20 comprises aperture 44 which allows filtered coherently combined beam 32 corresponding to the desired phase combination to propagate through. Thus, spatial filter 20 may act as an aperture stop that suppresses (creates loss) for other coherently combined beams 30 corresponding to undesired phase combinations. These suppressed coherently combined beams 30 are represented by the "X's" on spatial filter 20 as shown in FIG. 1.

In some aspects, output coupling mirror 22 is disposed along first optical path 24 after spatial filter 20. Output coupling mirror 22 produces at least a portion of filtered coherently combined beam 32 and reflects at least a portion of filtered coherently combined beam 32 along second optical path 26 (e.g., reflected filtered coherently combined beam 34). By reflecting filtered coherently combined beam 32 back along second optical path 26, output coupling mirror 20 provides feedback for (e.g., enhances) the desired phase combination. Because other coherently combined beams 30 corresponding to undesired phase combinations are blocked by spatial filter 20, these beams do not experience external feedback. On the other hand, filtered coherently combined beam 32 corresponding to the desired phase combination is able to pass through spatial filter 20 (both along first optical path 24 and along second optical path 26) to provide feedback to optical system 100.

Along second optical path 26, spatial filter 20 filters through reflected filtered coherently combined beam 34. Lens 14b focuses reflected filtered coherently combined beam 34 at focal plane 17. Phase screen 16 divides reflected filtered coherently combined beam 34 at focal plane 17 into an array of reflected beams (e.g., shown in FIG. 1 in the same path as array of output beams 28 but proceeding along the direction of second optical path 26 as opposed to first optical path 24). Lens 14a collimates this array of reflected beams towards array of laser emitters 10. Array of collimating lenses 12 couples the collimated array of reflected beams into array of laser emitter 10. Array of laser emitters 10 receives at each emitter a corresponding reflected beam of the array of reflected beams. Because each beam of the array of reflected beams includes a phase corresponding to the desired phase combination of filtered coherently combined beam 32, each emitter of array of laser emitters 10 may self-organize to oscillate towards the phase of the received reflected beam. The tendency of a laser to oscillate in the lowest-loss mode may be what drives this self-organizing behavior. As a result, each emitter may emit an output beam along first optical path 24 with a phase corresponding to a phase of the received reflected beam. The common feedback path may lock the phase of each emitter to the other emitters of array of laser emitters 10. The feedback produced by optical system 100 may enforce mutual coherence and select the proper phase of each emitter of array of laser emitters 10.

The optical path of optical system 100 may not be limited to a linear path as shown in FIG. 1. For example, the optical components shown in FIG. 1 may be arranged along an optical path comprising mirrors, lenses, beam splitters, beam combiners, or other suitable optical components such that first optical path 24 may traverse a non-linear path.

Mathematics may be used to describe optical system 100, in accordance with various aspects of the subject disclosure. For the purposes of this description, consider the emitters from array of laser emitters 10 to be point sources. The transverse coordinates in the emitter plane may be denoted by (x,y); the transverse coordinates in the transform plane may be denoted by (u,v). The combined complex field in the plane of the emitters may be given $$\text{by } U(x,y) = \sum_{m=1}^{N} \sum_{n=1}^{N} A_{m,n} \exp(j\Phi_{m,n}) \delta(x-x_m) \delta(y-y_n) \quad (1)$$

The corresponding complex field (e.g., at focal plane 15) may be given by $$\hat{U}(u,v) = \sum_{m=1}^{N} \sum_{n=1}^{N} A_{m,n} \exp\left[j\left(\Phi_{m,n} + \frac{2\pi}{\lambda f}(x_m u + y_n v)\right)\right] \quad (2)$$

$$= |\hat{U}(u,v)| \exp[j\Psi(u,v)]$$

Aspects of the subject disclosure employ the strategy of assuming that all amplitudes are equal and that the emitter phases are free parameters to be adjusted with the goal of minimizing the intensity variations in the transform plane. One reason for this goal may be that, if the intensity variations are eliminated, then the resulting field in the transform plane can be completely controlled with a phase-only compensation element (e.g., phase screen 16). For a beam combiner, the desired optical phase versus position distribution may be one that cancels the variations of complex-field phase $\Psi(u,v)$ in the transform plane. If intensity and phase variations are both eliminated, the field may propagate along the optical axis (e.g., along first optical path 24) as a plane wave. Note that the beam-combiner phase distribution generated by this method may be the conjugate of the phase distribution desired for the inverse problem of designing a fan-out element.

The mathematical phase-adjustment technique used in accordance with various aspects of the subject disclosure may be to define an objective function F to be minimized by employing one of a variety of global minimization techniques such as downhill simplex, simulated annealing, a so-called genetic algorithm, or other minimization methods known to those of skill in the art. F may be given by $$F = \int\int_{\substack{transform \\ plane}} \left[|\hat{U}(u,v)|^2 - \langle|\hat{U}(u,v)|^2\rangle\right] du\, dv \quad (3)$$

Figure 4:
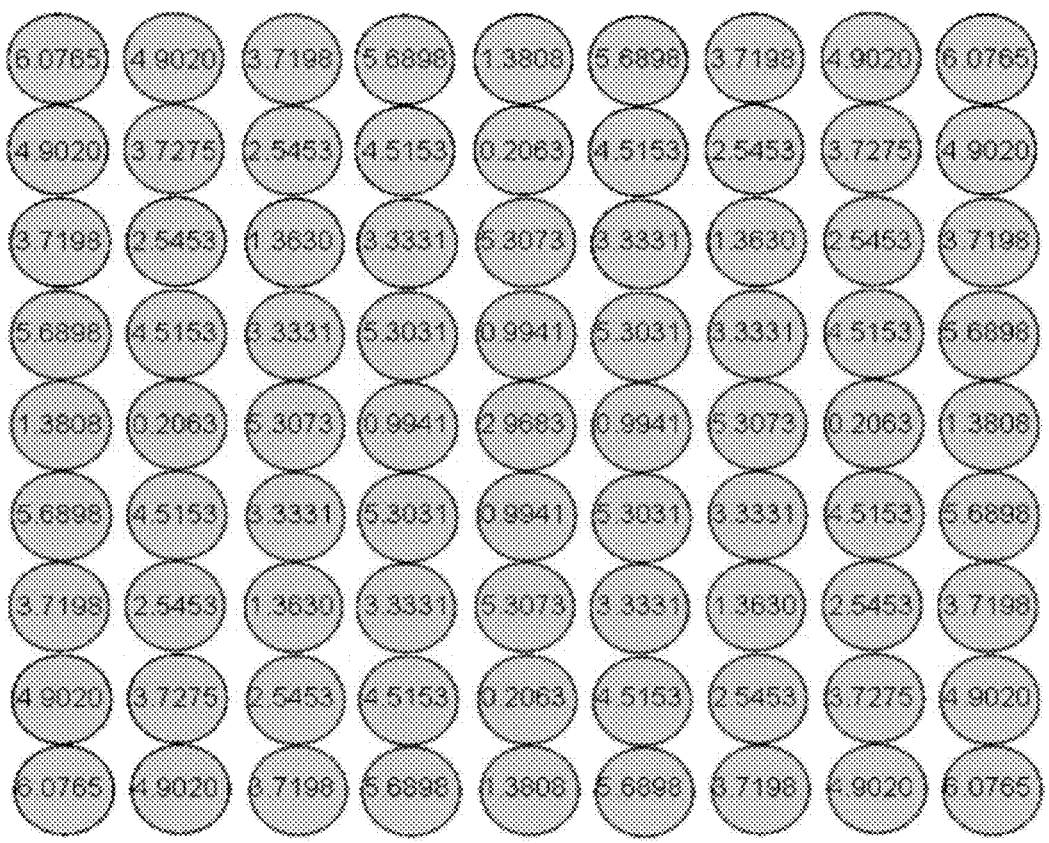
FIG. 4 illustrates an example of tuning-plate phase values (in radians) to combine a 9×9 array of mutually-coherent emitters as in FIG. 3B.
Figure 5:
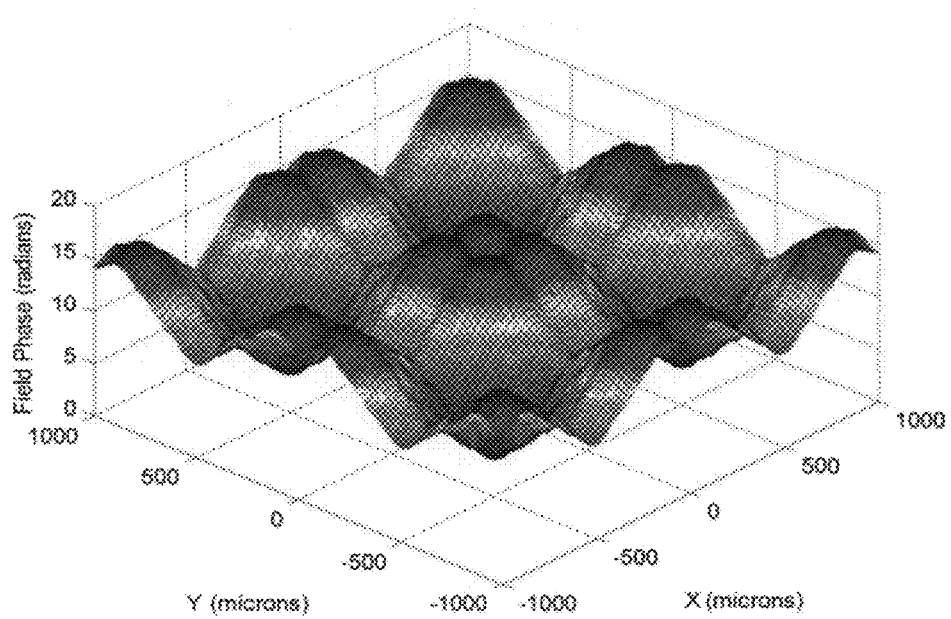
FIG. 5 illustrates an example of a phase versus position map of a combined field in the transform plane when element phases are adjusted according to FIG. 4.
Figure 6:
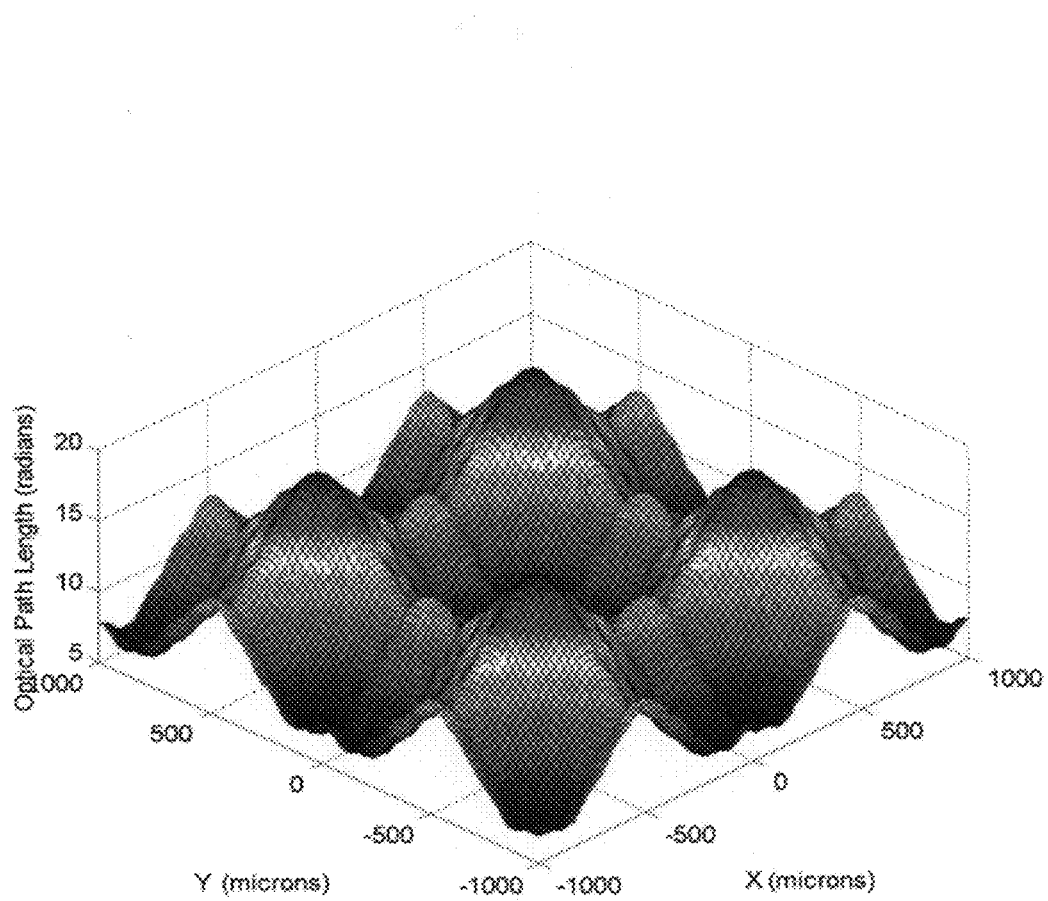
FIG. 6 illustrates an example of a phase versus position map of a phase screen designed to compensate combined-field phase variations shown in FIG. 5.

FIG. 4 illustrates an example of phase tuner array phase values (in radians) to combine a 9×9 array of mutually-coherent emitters as in FIG. 3B. As shown in FIG. 4, an array of laser emitters may comprise a 9×9 array, each emitter of the array having a phase (in radians). The phases of the 9×9 array may be adjusted to minimize intensity variations in a transform plane (e.g., focal plane 15). Thus, the phases of the 9×9 array shown in FIG. 4 may result from application of the downhill simplex method as described above with respect to FIG. 1. FIG. 5 illustrates an example of a phase versus position map of a combined field in the transform plane when element phases are adjusted according to FIG. 4. FIG. 6 illustrates an example of a phase versus position map of a phase screen designed to compensate combined-field phase variations shown in FIG. 5. For example, an optical path length distribution of the phase screen may be designed to cancel the phase variations of the field. Note that the phase surface shown in FIG. 6 is the conjugate of the surface shown in FIG. 5.

Figure 7:
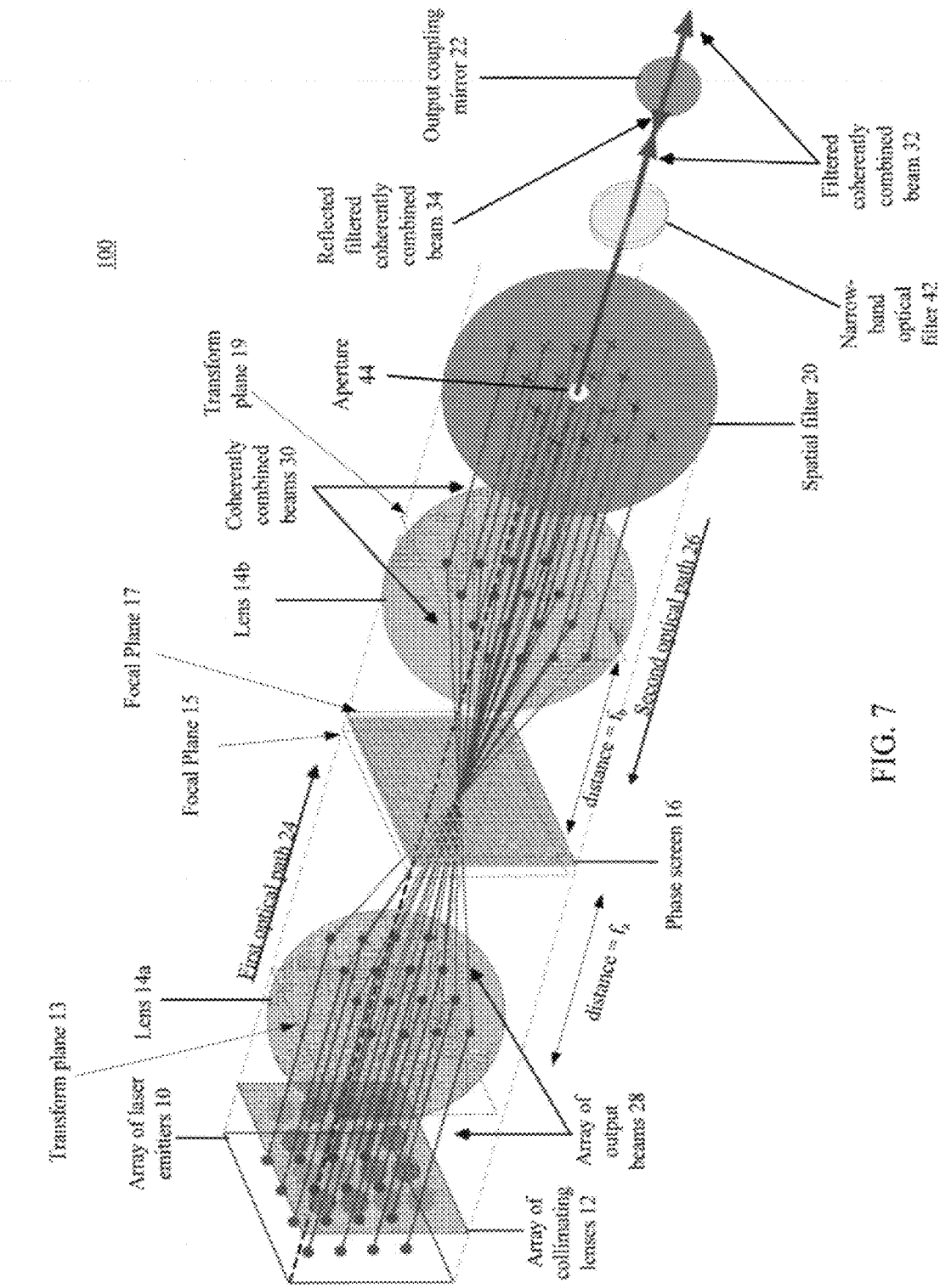
FIG. 7 illustrates an example of an optical system, in accordance with one aspect of the subject disclosure.

FIG. 7 illustrates an example of optical system 100, in accordance with one aspect of the subject disclosure. Optical system 100 may further comprise a narrow-band optical filter 42 disposed along first optical path 24 after spatial filter 20 and before output coupling mirror 22. Narrow-band optical filter 42 may narrow a spectral bandwith of filtered coherently combined beam 32 and/or reflected filtered coherently combined beam 34 (e.g., the optical feedback from output coupling mirror 22) in order to improve the ability to stabilize the optical phases of the emitters of array of laser emitters 10. Narrow-band optical filter 42 may comprise at least one of a Fabry-Perot etalon, an interference filter, a volume Bragg grating, and other suitable wavelength/intra-cavity tuning means known to those of skill in the art.

Figure 8A:
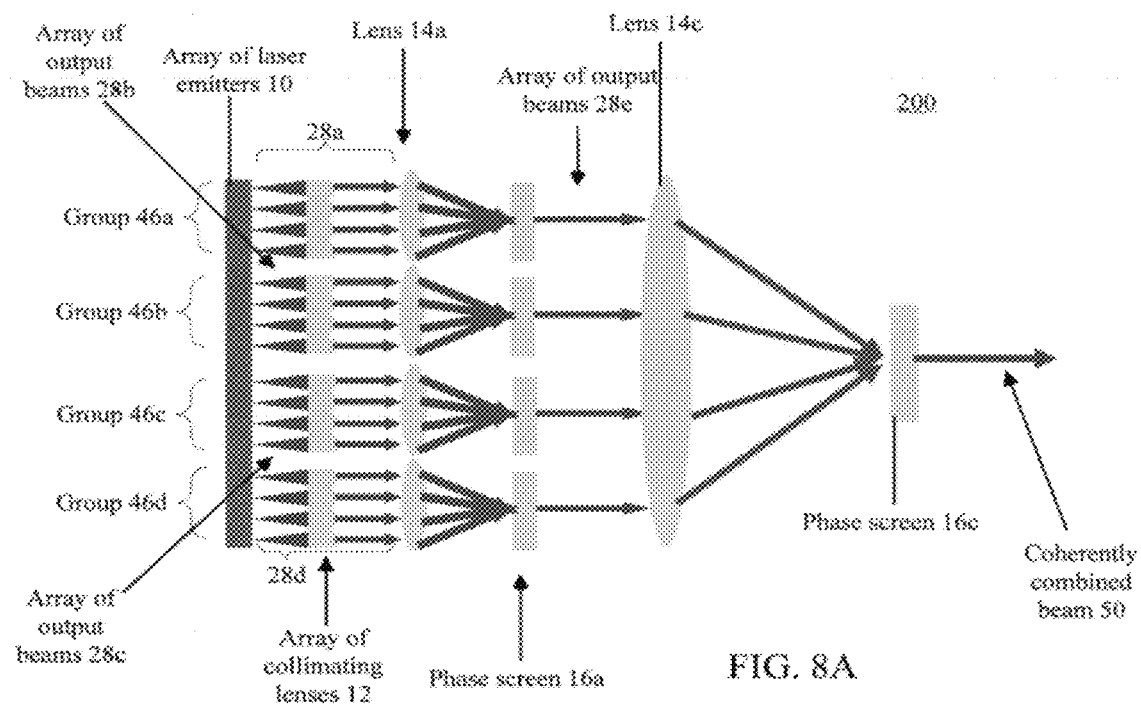
FIGS. 8A and 8B illustrate examples of an optical system with cascaded phase screens, interspersed with one or more lenses, for combining multiple arrays of output beams, in accordance with various aspects of the subject disclosure.
Figure 8B:
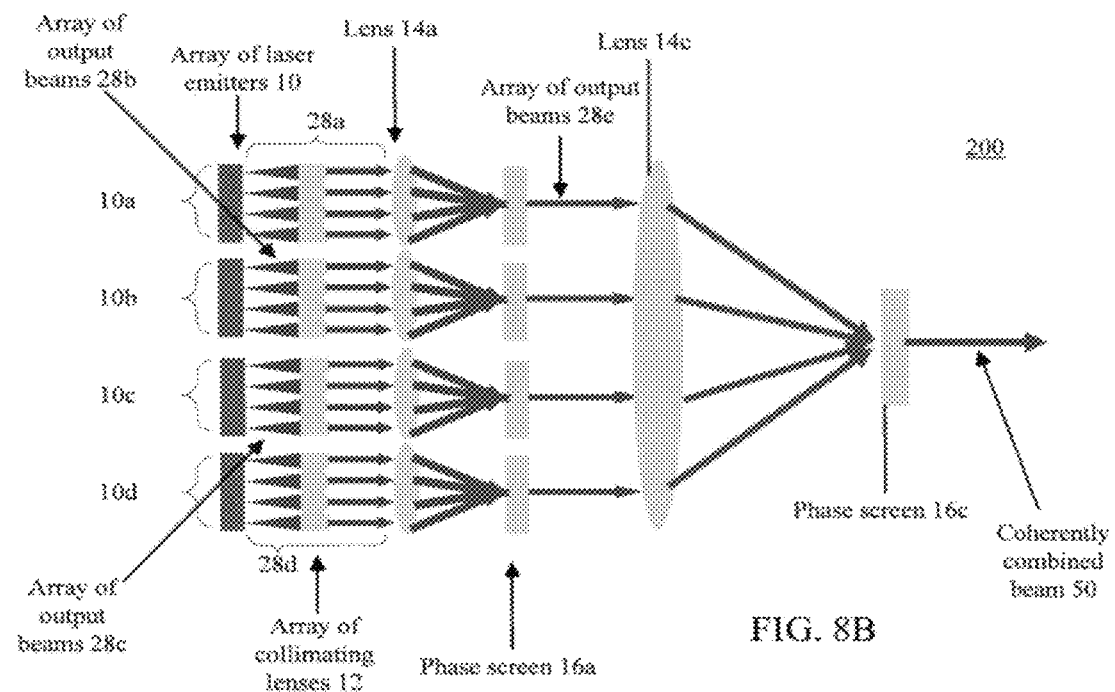

FIGS. 8A and 8B illustrate examples of optical system 200 with cascaded phase screens 16 (e.g., phase screens 16a and 16c), interspersed with one or more lenses 14 (e.g., lenses 14a and 14c), for combining multiple arrays of output beams 28 (e.g., array of output beams 28a, 28b, 28c, and 28d), in accordance with various aspects of the subject disclosure. Multiple phase screens 16 and lenses 14 may be used indefinitely to scale the coherent beam combining approach as described with respect to FIG. 1 in order to coherently combine multiple arrays of output beams 28. For example, multiple phase screens 16a (e.g., with smaller fan-in's relative to the total number of output beams 28 generated by one or more arrays of laser emitters 10) may be used to match the size of the one or more arrays of laser emitters 10. Optical system 200 comprises one or more arrays of laser emitters 10, one or more arrays of collimating lenses 12, one or more lenses 14, and one or more phase screens 16.

In some aspects, as shown in FIG. 8A, optical system 200 comprises a single array of laser emitters 10, with multiple groups 46 (e.g., groups 46a, 46b, 46c, and 46d) of laser emitters corresponding to multiple arrays of output beams 28 respectively (e.g., array of output beams 28a, 28b, 28c, and 28d). In one example, the single array of laser emitters 10 may comprise 32×32 emitters or more, which may separated into one or more groups 46 of laser emitters. In some aspects, as shown in FIG. 8B, optical system 200 comprises multiple arrays of laser emitters 10 (e.g., 10a, 10b, 10c, and 10d) corresponding to multiple arrays of output beams 28 respectively (e.g., array of output beams 28a, 28b, 28c, and 28d).

Optical system 200 may combine the multiple arrays of output beams 28 similar to combining a single array of output beams 28 (e.g., as described with respect to FIG. 1). For example, each phase screen 16a may combine each respective array of output beams 28 into a single beam. The single beams generated from each phase screen 16a may form array of output beams 28e. Lens 14c focuses array of output beams 28e at a focal plane (e.g., a back focal plane of lens 14c as viewed from left to right in FIGS. 8A and 8B). As shown in FIGS. 8A and 8B, this focal plane may be the plane at which phase screen 16c is disposed. Thus, lens 14c generates a spatial Fourier Transform of array of output beams 28e at the focal plane. Phase screen 16c is disposed along an optical path after lens 14c and combines the focused array of output beams 28e at the focal plane to generate coherently combined beam 50.

Figure 9:
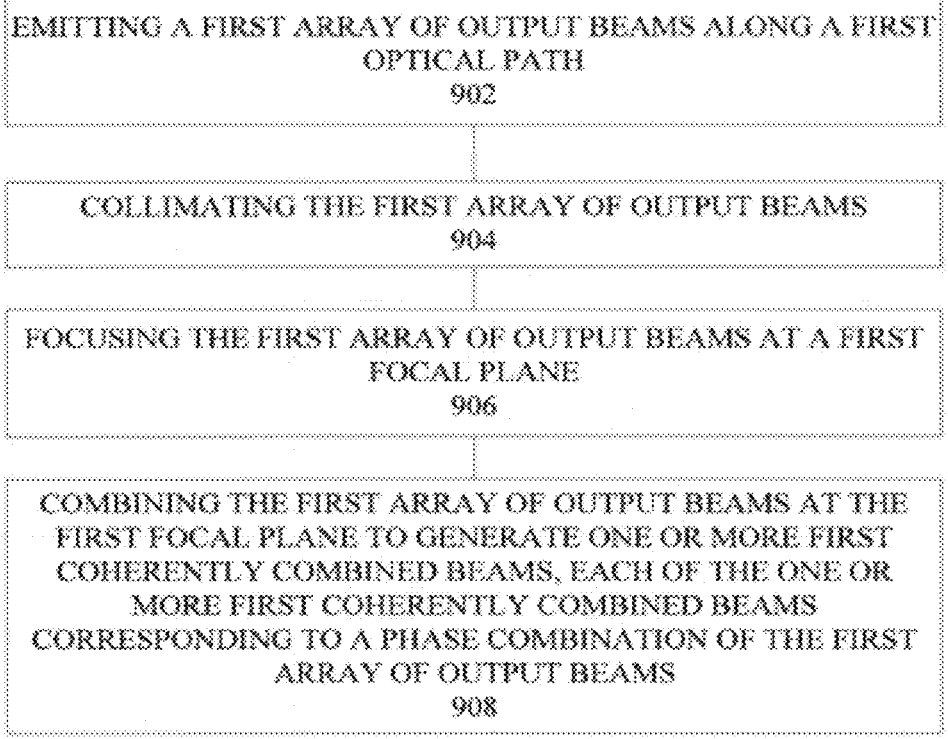
FIG. 9 illustrates an example of a method for combining beams, in accordance with one aspect of the subject disclosure.

FIG. 9 illustrates an example of method 900 for combining beams, in accordance with one aspect of the subject disclosure. Method 900 comprises emitting a first array of output beams along a first optical path (902) and collimating the first array of output beams (904). Method 900 also comprises focusing the first array of output beams at a first focal plane (906). Method 900 also comprises combining the first array of output beams at the first focal plane to generate one or more first coherently combined beams. Each of the one or more first coherently combined beams corresponds to a phase combination of the first array of output beams (908).

Figure 10:
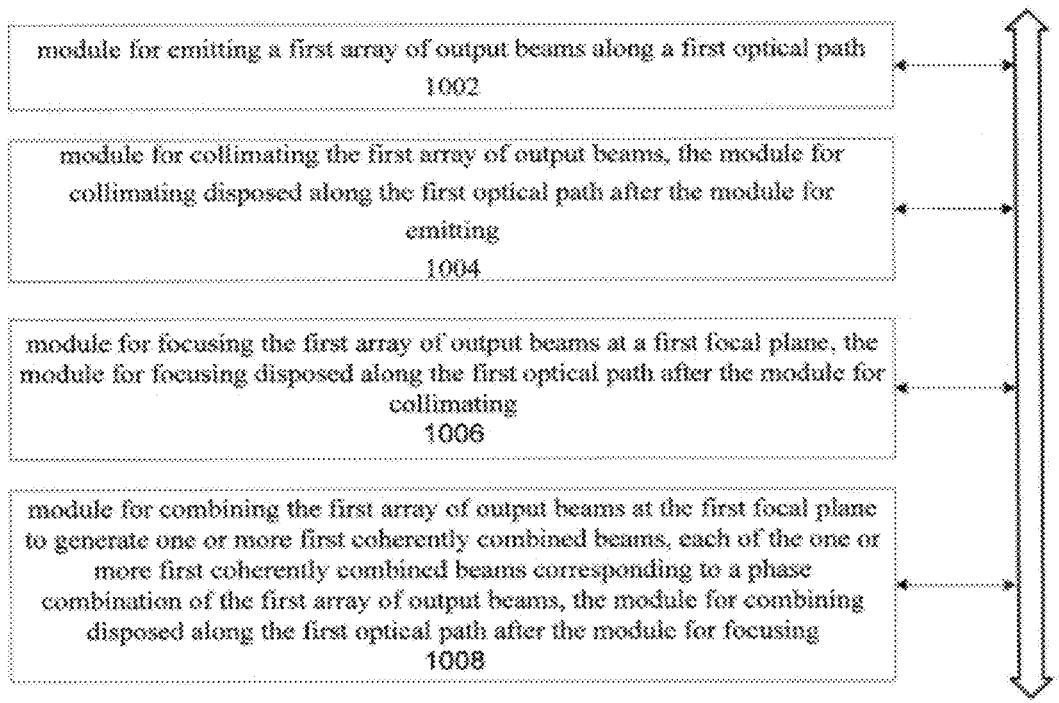
FIG. 10 illustrates an example of a system for combining beams, in accordance with one aspect of the subject disclosure.

FIG. 10 illustrates an example of system 1000 for combining beams, in accordance with one aspect of the subject disclosure. System 1000 comprises a module for emitting a first array of output beams along a first optical path (1002) and a module for collimating the first array of output beams. The module for collimating is disposed along the first optical path after the module for emitting (1004). System 1000 also comprises a module for focusing the first array of output beams at a first focal plane. The module for focusing is disposed along the first optical path after the module for collimating (1006). System 1000 also comprises a module for combining the first array of output beams at the first focal plane to generate one or more first coherently combined beams. Each of the one or more first coherently combined beams corresponds to a phase combination of the first array of output beams. The module for combining is disposed along the first optical path after the module for focusing (1008).

The foregoing description is provided to enable a person skilled in the art to practice the various configurations described herein. While the present invention has been particularly described with reference to the various figures and configurations, it should be understood that these are for illustration purposes only and should not be taken as limiting the scope of the invention.

There may be many other ways to implement the invention. Various functions and elements described herein may be partitioned differently from those shown without departing from the sprit and scope of the invention. Various modifications to these configurations will be readily apparent to those skilled in the art, and generic principles defined herein may be applied to other configurations. Thus, many changes and modifications may be made to the invention, by one having ordinary skill in the art, without departing from the spirit and scope of the invention.

It is understood that the specific order or hierarchy of steps in the processes disclosed is an illustration of exemplary approaches. Based upon design preferences, it is understood that the specific order or hierarchy of steps in the processes may be rearranged. Some of the steps may be performed simultaneously. The accompanying method claims present elements of the various steps in a sample order, and are not meant to be limited to the specific order or hierarchy presented.

Terms such as "top," "bottom," "front," "rear" and the like as used in this disclosure should be understood as referring to an arbitrary frame of reference, rather than to the ordinary gravitational frame of reference. Thus, a top surface, a bottom surface, a front surface, and a rear surface may extend upwardly, downwardly, diagonally, or horizontally in a gravitational frame of reference.

A phrase such as an "aspect" does not imply that such aspect is essential to the subject technology or that such aspect applies to all configurations of the subject technology. A disclosure relating to an aspect may apply to all configurations, or one or more configurations. A phrase such as an aspect may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. A phrase such an embodiment may refer to one or more embodiments and vice versa.

Furthermore, to the extent that the term "include," "have," or the like is used in the description or the claims, such term is intended to be inclusive in a manner similar to the term "comprise" as "comprise" is interpreted when employed as a transitional word in a claim.

The word "exemplary" is used herein to mean "serving as an example, instance, or illustration." Any embodiment described herein as "exemplary" is not necessarily to be construed as preferred or advantageous over other embodiments.

A reference to an element in the singular is not intended to mean "one and only one" unless specifically stated, but rather "one or more." The term "some" refers to one or more. All structural and functional equivalents to the elements of the various configurations described throughout this disclosure that are known or later come to be known to those of ordinary skill in the art are expressly incorporated herein by reference and intended to be encompassed by the invention. Moreover, nothing disclosed herein is intended to be dedicated to the public regardless of whether such disclosure is explicitly recited in the above description.

What is claimed is:

1. A system for combining beams comprising:
   a first array of laser emitters configured to emit a first array of output beams along a first optical path;
   a first array of collimating lenses disposed along the first optical path after the first array of laser emitters, configured to collimate the first array of output beams;
   a first lens disposed along the first optical path after the first array of collimating lenses, configured to focus the first array of output beams at a first focal plane;
   a first phase screen disposed along the first optical path after the first lens, configured to combine the first array of output beams at the first focal plane to generate one or more first coherently combined beams, each of the one or more first coherently combined beams corresponding to a phase combination of the first array of output beams;
   a spatial filter disposed along the first optical path after the first phase screen, configured to filter through one of the one or more first coherently combined beams corresponding to a desired phase combination of the first array of output beams; and
   an output coupling mirror disposed along the first optical path after the spatial filter, configured to produce at least a portion of the filtered first coherently combined beam and reflect at least a portion of the filtered first coherently combined beam along a second optical path opposite in direction to the first optical path.

2. The system of claim 1, wherein the spatial filter is further configured to filter through the reflected filtered first coherently combined beam along the second optical path, wherein the first phase screen is further configured to divide the reflected filtered first coherently combined beam into an array of reflected beams, wherein the first lens is further configured to collimate the array of reflected beams, wherein the first array of collimating lenses is further configured to couple the array of reflected beams into the first array of laser emitters, wherein the first array of laser emitters is configured to receive at each laser emitter of the first array of laser emitters a corresponding reflected beam of the array of reflected beams, and wherein each laser emitter is configured to emit an output beam along the first optical path with a phase corresponding to a phase of the received corresponding reflected beam.

3. The system of claim 2, wherein at least one laser emitter of the first array of laser emitters is adjusted such that susceptibility of the at least one emitter to receiving a corresponding reflected beam of the array of reflected beams is increased.

4. The system of claim 1, further comprising a second lens disposed along the first optical path after the first phase screen and before the spatial filter, configured to collimate the one or more first coherently combined beams.

5. The system of claim 1, further comprising a narrow-band optical filter disposed along the first optical path after the spatial filter and before the output coupling mirror, configured to narrow a spectral bandwidth of the filtered first coherently combined beam.

6. The system of claim 5, wherein the narrow-band optical filter comprises at least one of a Fabry-Perot etalon, an interference filter, and a volume Bragg grating.

7. The system of claim 1, wherein the first array of laser emitters comprises at least one of an array of fiber lasers and an array of vertical-cavity surface-emitting lasers.

8. The system of claim 1, wherein the first phase screen comprises at least one of glass, fused silica, and quartz, and wherein the first phase screen does not attenuate amplitudes of the first array of output beams.

9. The system of claim 1, further comprising:
   a second array of laser emitters configured to emit a second array of output beams along a third optical path;
   a second array of collimating lenses disposed along the third optical path after the second array of laser emitters, configured to collimate the second array of output beams;
   a second lens disposed along the third optical path after the second array of collimating lenses, configured to focus the second array of output beams at a second focal plane;
   a second phase screen disposed along the third optical path after the second lens, configured to combine the second array of output beams at the second focal plane to generate one or more second coherently combined beams, each of the one or more second coherently combined beams corresponding to a phase combination of the second array of output beams;
   a third lens disposed along a fourth optical path after the first phase screen and the second phase screen, configured to focus the one or more first coherently combined beams and the one or more second coherently combined beams at a third focal plane; and a third phase screen disposed along the fourth optical path after the third lens, configured to combine the one or more first coherently combined beams and the one or more second coherently combined beams at the third focal plane to generate one or more third coherently combined beams, each of the one or more third coherently combined beams corresponding to a phase combination of the one or more first coherently combined beams and the one or more second coherently combined beams.

10. A method for combining beams comprising:
emitting a first array of output beams along a first optical path;
collimating the first array of output beams;
focusing the first array of output beams at a first focal plane;
combining the first array of output beams at the first focal plane to generate one or more first coherently combined beams, each of the one or more first coherently combined beams corresponding to a phase combination of the first array of output beams;
filtering through one of the one or more first coherently combined beams corresponding to a desired phase combination of the first array of output beams;
producing at least a portion of the filtered first coherently combined beam; and
reflecting at least a portion of the filtered first coherently combined beam along a second optical path opposite in direction to the first optical path.

11. The method of claim 10, further comprising:
filtering through the reflected filtered first coherently combined beam along the second optical path;
dividing the reflected filtered first coherently combined beam into an array of reflected beams;
collimating the array of reflected beams;
receiving the array of reflected beams; and
emitting an array of output beams along the first optical path, each output beam with a phase corresponding to a phase of a received reflected beam of the array of reflected beams.

12. The method of claim 10, further comprising collimating the one or more first coherently combined beams.

13. The method of claim 10, further comprising narrowing a spectral bandwidth of the filtered first coherently combined beam.

14. The method of claim 10, further comprising:
emitting a second array of output beams along a third optical path corresponding to the first optical path;
collimating the second array of output beams;
focusing the second array of output beams at a second focal plane;
combining the second array of output beams at the second focal plane to generate one or more second coherently combined beams, each of the one or more second coherently combined beams corresponding to a phase combination of the second array of output beams;
focusing the one or more first coherently combined beams and the one or more second coherently combined beams at a third focal plane; and
combining the one or more first coherently combined beams and the one or more second coherently combined beams at the third focal plane to generate one or more third coherently combined beams, each of the one or more third coherently combined beams corresponding to a phase combination of the one or more first coherently combined beams and the one or more second coherently combined beams.

15. A system for combining beams comprising:
means for emitting a first array of output beams along a first optical path;
means for collimating the first array of output beams, the means for collimating disposed along the first optical path after the means for emitting;
means for focusing the first array of output beams at a first focal plane, the means for focusing disposed along the first optical path after the means for collimating;
means for combining the first array of output beams at the first focal plane to generate one or more first coherently combined beams, each of the one or more first coherently combined beams corresponding to a phase combination of the first array of output beams, the means for combining disposed along the first optical path after the means for focusing;
means for filtering through one of the one or more first coherently combined beams corresponding to a desired phase combination of the first array of output beams;
means for producing at least a portion of the filtered first coherently combined beam; and
means for reflecting at least a portion of the filtered first coherently combined beam along a second optical path opposite in direction to the first optical path.

16. The system of claim 15, wherein the means for filtering is configured to filter through the reflected filtered first coherently combined beam along the second optical path, wherein the means for combining is configured to divide the reflected filtered first coherently combined beam into an array of reflected beams, wherein the means for focusing is configured to collimate the array of reflected beams, wherein the means for collimating is configured to couple the array of reflected beams into the means for emitting, and wherein the means for emitting is configured to receive the array of reflected beams and emit an array of output beams along the first optical path, each output beam with a phase corresponding to a phase of a received reflected beam of the array of reflected beams.

17. The system of claim 15, further comprising means for narrowing a spectral bandwidth of the filtered first coherently combined beam.

18. A system for combining beams comprising:
a first array of laser emitters configured to emit a first array of output beams along a first optical path;
a first array of collimating lenses disposed along the first optical path after the first array of laser emitters, configured to collimate the first array of output beams;
a first lens disposed along the first optical path after the first array of collimating lenses, configured to focus the first array of output beams at a first focal plane; and
a first phase screen disposed along the first optical path after the first lens, configured to combine the first array of output beams at the first focal plane to generate one or more first coherently combined beams, each of the one or more first coherently combined beams corresponding to a phase combination of the first array of output beams,
wherein the first phase screen comprises at least one of glass, fused silica, and quartz, and
wherein the first phase screen does not attenuate amplitudes of the first array of output beams.

19. A system for combining beams comprising:
a first array of laser emitters configured to emit a first array of output beams along a first optical path;
a first array of collimating lenses disposed along the first optical path after the first array of laser emitters, configured to collimate the first array of output beams;

a first lens disposed along the first optical path after the first array of collimating lenses, configured to focus the first array of output beams at a first focal plane;

a first phase screen disposed along the first optical path after the first lens, configured to combine the first array of output beams at the first focal plane to generate one or more first coherently combined beams, each of the one or more first coherently combined beams corresponding to a phase combination of the first array of output beams;

a second array of laser emitters configured to emit a second array of output beams along a second optical path;

a second array of collimating lenses disposed along the second optical path after the second array of laser emitters, configured to collimate the second array of output beams;

a second lens disposed along the second optical path after the second array of collimating lenses, configured to focus the second array of output beams at a second focal plane;

a second phase screen disposed along the second optical path after the second lens, configured to combine the second array of output beams at the second focal plane to generate one or more second coherently combined beams, each of the one or more second coherently combined beams corresponding to a phase combination of the second array of output beams;

a third lens disposed along a third optical path after the first phase screen and the second phase screen, configured to focus the one or more first coherently combined beams and the one or more second coherently combined beams at a third focal plane; and a third phase screen disposed along the third optical path after the third lens, configured to combine the one or more first coherently combined beams and the one or more second coherently combined beams at the third focal plane to generate one or more third coherently combined beams, each of the one or more third coherently combined beams corresponding to a phase combination of the one or more first coherently combined beams and the one or more second coherently combined beams.

20. The system of claim 19, further comprising:

a spatial filter disposed along the third optical path after the third phase screen, configured to filter through one of the one or more third coherently combined beams corresponding to a desired phase combination of the one or more first coherently combined beams and the one or more second coherently combined beams; and an output coupling mirror disposed along the third optical path after the spatial filter, configured to produce at least a portion of the filtered third coherently combined beam and reflect at least a portion of the filtered third coherently combined beam along a fourth optical path opposite in direction to the third optical path.

21. A method for combining beams comprising:

emitting a first array of output beams along a first optical path;

collimating the first array of output beams;

focusing the first array of output beams at a first focal plane;

combining the first array of output beams at the first focal plane to generate one or more first coherently combined beams, each of the one or more first coherently combined beams corresponding to a phase combination of the first array of output beams;

emitting a second array of output beams along a second optical path corresponding to the first optical path;

collimating the second array of output beams;

focusing the second array of output beams at a second focal plane;

combining the second array of output beams at the second focal plane to generate one or more second coherently combined beams, each of the one or more second coherently combined beams corresponding to a phase combination of the second array of output beams;

focusing the one or more first coherently combined beams and the one or more second coherently combined beams at a third focal plane; and combining the one or more first coherently combined beams and the one or more second coherently combined beams at the third focal plane to generate one or more third coherently combined beams, each of the one or more third coherently combined beams corresponding to a phase combination of the one or more first coherently combined beams and the one or more second coherently combined beams.

* * * * *